United States Patent
Lee et al.

(10) Patent No.: US 8,304,898 B2
(45) Date of Patent: Nov. 6, 2012

(54) INTEGRATED CIRCUIT PACKAGE SYSTEM WITH OVERHANG FILM

(75) Inventors: Hye Ran Lee, Ichon-si (KR); Sang Ha Hwang, Ichon-si (KR); Gyung Sik Yun, Ichon si (KR)

(73) Assignee: STATS ChipPAC Ltd., Singapore (SG)

( * ) Notice: Subject to any disclaimer, the term of this patent is extended or adjusted under 35 U.S.C. 154(b) by 449 days.

(21) Appl. No.: 12/037,343

(22) Filed: Feb. 26, 2008

(65) Prior Publication Data
US 2009/0212419 A1    Aug. 27, 2009

(51) Int. Cl.
*H01L 23/24* (2006.01)
(52) U.S. Cl. .................. 257/723; 257/784; 257/E23.085
(58) Field of Classification Search .................. 257/686, 257/723, 724, 784, 736, E23.17, E23.141, 257/E23.169, E23.085
See application file for complete search history.

(56) References Cited

U.S. PATENT DOCUMENTS

| 6,336,269 | B1 | 1/2002 | Eldridge et al. |
| 6,521,881 | B2 * | 2/2003 | Tu et al. ..................... 250/208.1 |
| 6,956,283 | B1 | 10/2005 | Peterson |
| 7,005,577 | B2 * | 2/2006 | Lee et al. ..................... 174/538 |
| 7,037,756 | B1 | 5/2006 | Jiang et al. |
| 2005/0012185 | A1 | 1/2005 | Peng et al. |

* cited by examiner

*Primary Examiner* — Matthew Landau
*Assistant Examiner* — Candice Chan
(74) *Attorney, Agent, or Firm* — Ishimaru & Associates LLP; Mikio Ishimaru; Stanley M. Chang

(57) ABSTRACT

An integrated circuit package system includes: connecting a first interconnect between a carrier and a bottom integrated circuit thereover; forming a film, having an overhang portion, over the bottom integrated circuit with the overhang portion over the first interconnect; mounting a top integrated circuit over the film; connecting a second interconnect between the top integrated circuit and the carrier with the overhang portion between the first interconnect and the second interconnect; and forming an encapsulation over the carrier covering the top integrated circuit, the film, the first interconnect, and the second interconnect.

20 Claims, 4 Drawing Sheets

INTEGRATED CIRCUIT PACKAGE SYSTEM WITH OVERHANG FILM

TECHNICAL FIELD

The present invention relates generally to an integrated circuit package system and more particularly to an integrated circuit package system having a wire.

BACKGROUND ART

In order to interface an integrated circuit with other circuitry, it is common to mount it on a lead frame or substrate. Each integrated circuit has bonding pads that are individually connected to the substrate's contact or terminal pads using extremely fine gold or aluminum wires or conductive balls, such as solder balls. The assemblies are then packaged by individually encapsulating them in molded plastic or ceramic bodies to create an integrated circuit package.

Integrated circuit packaging technology has seen an increase in the number of integrated circuits mounted on a single circuit board or substrate. The new packaging designs are more compact form factors, such as the physical size and shape of a packaged integrated circuit, and providing a significant increase in overall integrated circuit density.

However, integrated circuit density continues to be limited by the "real estate" available for mounting individual integrated circuits on a substrate. Even larger form factor systems, such as personal computers (PC's), compute servers, and storage servers, need more integrated circuits in the same or smaller "real estate". Particularly acute, the needs for portable personal electronics, such as cell phones, digital cameras, music players, personal digital assistants (PDA's), and location-based devices, have further driven the need for increased integrated circuit density.

This increased integrated circuit density has led to the development of multi-chip packages in which more than one integrated circuit can be packaged. Each package provides mechanical support for the individual integrated circuits and one or more layers of interconnect lines that enable the integrated circuits to be connected electrically to surrounding circuitry.

Current multi-chip packages, also commonly referred to as multi-chip modules, typically consist of a printed circuit board (PCB) substrate onto which a set of separate integrated circuit components are directly attached. Such multi-chip packages have been found to increase integrated circuit density and miniaturization, improve signal propagation speed, reduce overall integrated circuit size and weight, improve performance, and lower costs—all primary goals of the computer industry.

Multi-chip packages whether vertically or horizontally arranged, can also present problems because they usually must be pre-assembled before the integrated circuit and integrated circuit connections can be tested. Vertically stacked integrated circuits in typical multi-chip packages can present problems beyond those of horizontally arranged integrated circuit packages, further complicating the manufacturing process. Increased input/output (I/O) density, decreased package height, and decreased cost targets all contribute to utilization of bond wires in stacked integrated circuits. These conditions increase the likelihood for wire shorting between wires connecting the various integrated circuits in the stack.

Thus, a need still remains for an integrated circuit package system providing low cost manufacturing, improved yield, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: connecting a first interconnect between a carrier and a bottom integrated circuit thereover; forming a film, having an overhang portion, over the bottom integrated circuit with the overhang portion over the first interconnect; mounting a top integrated circuit over the film; connecting a second interconnect between the top integrated circuit and the carrier with the overhang portion between the first interconnect and the second interconnect; and forming an encapsulation over the carrier covering the top integrated circuit, the film, the first interconnect, and the second interconnect.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
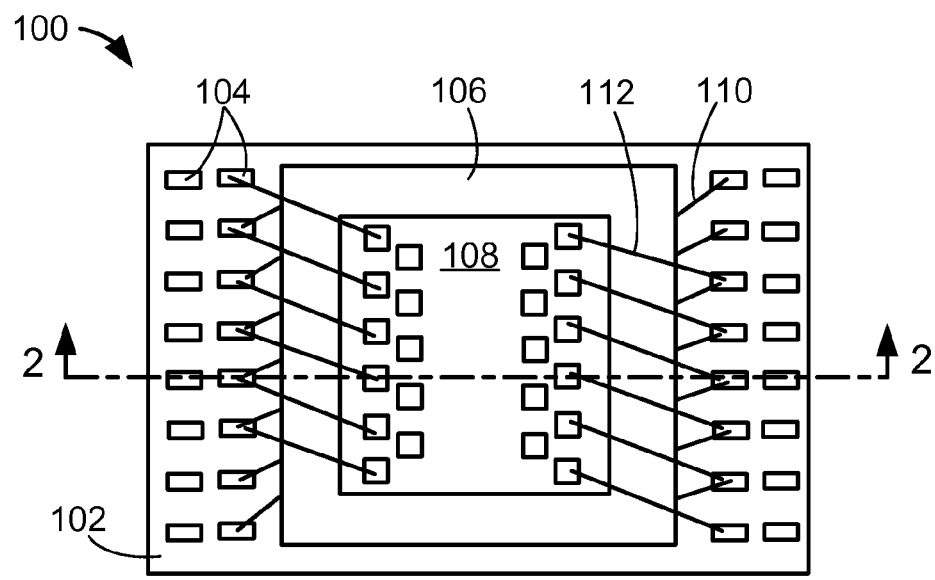
FIG. 1 is a top plan view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top plan view of an integrated circuit package system 100 in a first embodiment of the present invention. The top plan view depicts the integrated circuit package system 100 without a cover. The top plan view depicts a carrier 102, such as a laminated substrate, having contact pads 104. A film 106, such as an adhesive film, is over the carrier 102 not covering the contact pads 104. A top integrated circuit 108, such as an integrated circuit die, is over the film 106 and the carrier 102. As an example, the horizontal dimensions of the top integrated circuit 108 do not extend beyond the horizontal dimensions of the film 106.

First interconnects 110, such as bond wires or ribbon bond wires, can connect to a predetermined portions of the contact pads 104 and extending to and below the film 106. Second interconnects 112, such as bond wires or ribbon bond wires, can connect a predetermined portions of the contact pads 104 and the top integrated circuit 108. The film 106 separates the first interconnects 110 and the second interconnects 112 eliminating inadvertent shorting.

For illustrative purposes, the integrated circuit package system 100 is shown with the first interconnects 110 and the second interconnects 112 along two opposing sides of the top integrated circuit 108, although it is understood that the integrated circuit package system 100 may have the first interconnects 110 and the second interconnects 112 along different sides or number of sides of the top integrated circuit 108. For example, the integrated circuit package system 100 may have the first interconnects 110 and the second interconnects 112 along one side of the top integrated circuit 108 or along more than two sides of the top integrated circuit 108.

Figure 2:
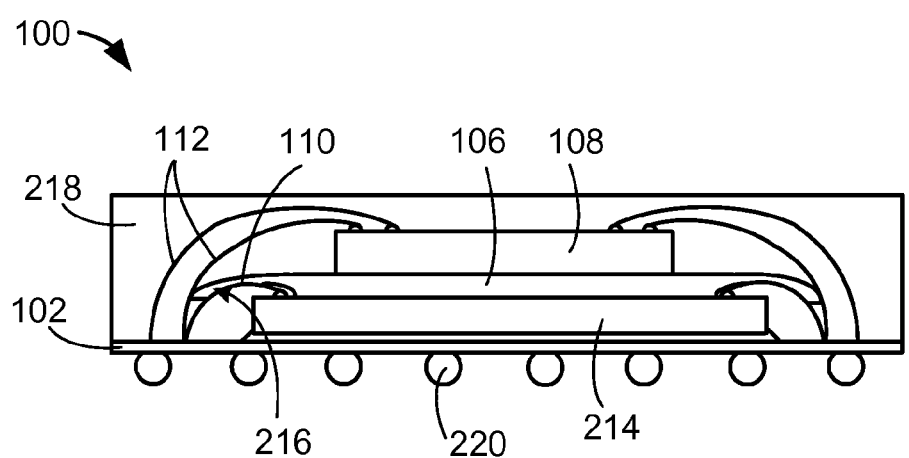
FIG. 2 is a cross-sectional view of the integrated circuit package system along line 2-2 of FIG. 1.

Referring now to FIG. 2, therein is shown a cross-sectional view of the integrated circuit package system 100 along line 2-2 of FIG. 1. The cross-sectional view depicts a bottom integrated circuit 214, such as an integrated circuit die, over the carrier 102. The film 106 is over the bottom integrated circuit 214 and under the top integrated circuit 108. The film 106 includes an overhang portion 216, such as a curved portion, that overhangs over the edges of the bottom integrated circuit 214 and is cantilevered over the first interconnects 110.

For illustrative purposes, the integrated circuit package system 100 is shown having the overhang portion 216 of the film 106 that curves overhang the bottom integrated circuit 214, although it is understood that the integrated circuit package system 100 may have a different configuration for the film 106. For example, the film 106 can include a planar portion (not shown) that forms the overhang beyond the edges of the bottom integrated circuit 214.

The first interconnects 110 connect the carrier 102 and the bottom integrated circuit 214. The overhang portion 216 can be over a portion of the first interconnects 110 adjacent to the edges of the bottom integrated circuit 214. As another example, the overhang portion 216 can be on the portion of the first interconnects 110 adjacent to the edges of the bottom integrated circuit 214.

The second interconnects 112 connect the carrier 102 and the top integrated circuit 108. The film 106 provides a physical and electrical separation between the first interconnects 110 and the second interconnects 112 thereby preventing inadvertent shorting. The isolation provided by the film 106 allows the reduction of the lengths of both the first interconnects 110 and the second interconnects 112 thereby reducing the profile of the integrated circuit package system 100. The overhang portion 216 of the film 106 is in direct contact with an instance of the first interconnects 110 and an instance of the second interconnects 112.

It has been discovered that the present invention provides an integrated circuit package system with reduced profile and horizontal dimension by using a film that serve multiple functions. The film serves as an adhesive between the top and bottom integrated circuits. The film also serves as a spacer allowing wires to connect to the bottom integrated circuit. The film further serves to isolate, physically and electrically, the wire connecting to the bottom integrated circuit and the top integrated circuit thereby eliminating inadvertent wire shorts.

An encapsulation 218, such as a cover comprising of epoxy molding compound, is over the carrier 102 covering the stack of the bottom integrated circuit 214 and the top integrated circuit 108, the film 106, the first interconnects 110, and the second interconnects 112. External interconnects 220, such as solder balls, can attach to a bottom side of the carrier 102.

For illustrative purposes, the integrated circuit package system 100 is shown with a stack of integrated circuit with the top integrated circuit 108 and the bottom integrated circuit 214, although it is understood that the integrated circuit package system 100 may include a stack of integrated circuits of a different configuration. For example, the integrated circuit package system 100 may include a stack of integrated circuits having more than two integrated circuits.

Figure 3:
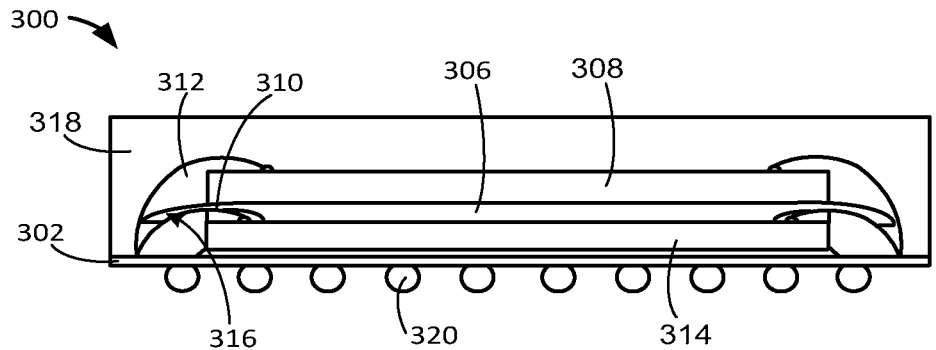
FIG. 3 is a cross-sectional view of an integrated circuit package system exemplified by the top plan view of FIG. 1 in a second embodiment of the present invention.

Referring now to FIG. 3, therein is shown a cross-sectional view of an integrated circuit package system 300 exemplified by the top plan view of FIG. 1 in a second embodiment of the present invention. The cross-sectional view depicts a bottom integrated circuit 314, such as an integrated circuit die, over a carrier 302, such as laminated substrate. A film 306, such as an adhesive film, is over the bottom integrated circuit 314 and under a top integrated circuit 308, such as integrated circuit die. As an example, the bottom integrated circuit 314 and the top integrated circuit 308 is shown as the same size. The film 306 includes an overhang portion 316, such as curved portion, that overhangs over the edges of the bottom integrated circuit 314.

For illustrative purposes, the integrated circuit package system 300 is shown having the overhang portion 316 of the film 306 that overhangs the bottom integrated circuit 314, although it is understood that the integrated circuit package system 300 may have a different configuration for the film 306. For example, the film 306 can include a planar portion (not shown) that forms the overhang beyond the edges of the bottom integrated circuit 314.

First interconnects 310, such as bond wires or ribbon bond wires, connect the carrier 302 and the bottom integrated circuit 314. Portions of the first interconnects 310 over the bottom integrated circuit 314 are between the bottom integrated circuit 314 and the top integrated circuit 308 as well as within the film 306. The overhang portion 316 can be over a portion of the first interconnects 310 adjacent to the edges of the bottom integrated circuit 314.

Second interconnects 312, such as bond wires or ribbon bond wires, connect the carrier 302 and the top integrated circuit 308. The film 306 provides a physical and electrical separation between the first interconnects 310 and the second interconnects 312 thereby preventing inadvertent shorting. The isolation provided by the film 306 allows the reduction of the lengths of both the first interconnects 310 and the second interconnects 312 thereby reducing the profile of the integrated circuit package system 300.

An encapsulation 318, such as a cover comprising of epoxy molding compound, is over the carrier 302 covering the stack of the bottom integrated circuit 314 and the top integrated circuit 308, the film 306, the first interconnects 310, and the second interconnects 312. External interconnects 320, such as solder balls, can attach to a bottom side of the carrier 302.

For illustrative purposes, the integrated circuit package system 300 is shown with a stack of integrated circuit with the top integrated circuit 308 and the bottom integrated circuit 314, although it is understood that the integrated circuit package system 300 may included a stack of integrated circuits of a different configuration. For example, the integrated circuit package system 300 may include a stack of integrated circuits having more than two integrated circuits.

Figure 4:
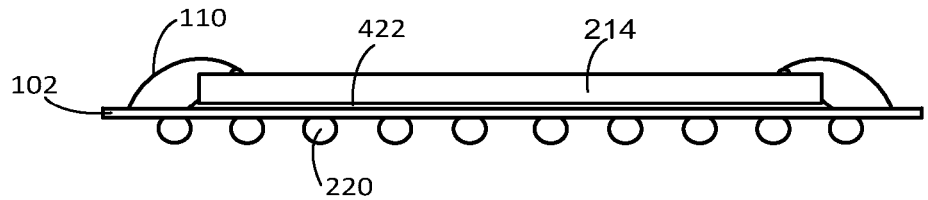
FIG. 4 is a cross-sectional view of an integrated circuit package system of FIG. 1 in a step attaching the first interconnects.

Referring now to FIG. 4, therein is shown a cross-sectional view of the integrated circuit package system 100 of FIG. 1 in a step attaching the first interconnects 110. The external interconnects 220 are shown below the carrier 102. The bottom integrated circuit 214 mounts over the carrier 102 with an adhesive 422, such as a die-attach adhesive. The first interconnects 110 connect the carrier 102 and the bottom integrated circuit 214.

Figure 5:
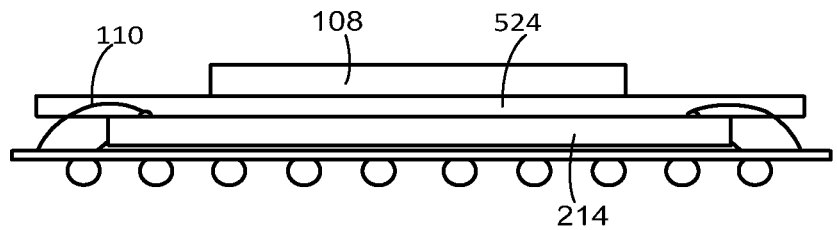
FIG. 5 is the structure of FIG. 4 in a step mounting the top integrated circuit.

Referring now to FIG. 5, therein is shown the structure of FIG. 4 in a step mounting the top integrated circuit 108. A film piece 524, such as a cut piece of adhesive film, is placed over the bottom integrated circuit 214 and the portion of the first interconnects 110 over the bottom integrated circuit 214. As an example, the film piece 524 is shown as planar and extends over the edges of the bottom integrated circuit 214. The top integrated circuit 108 mounts over the film piece 524 and the bottom integrated circuit 214. As an example, the top integrated circuit 108 is shown not extending beyond the edges of the bottom integrated circuit 214.

Figure 6:
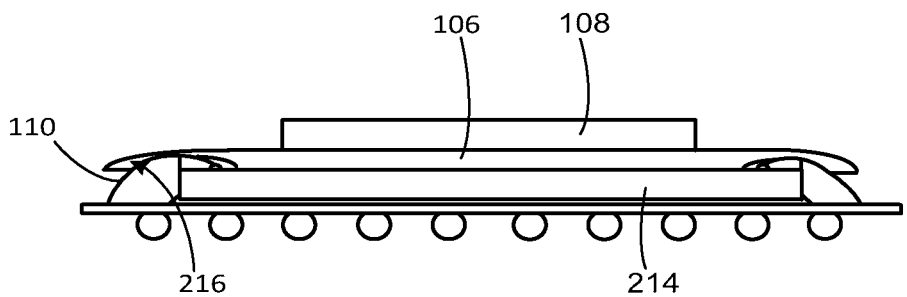
FIG. 6 is the structure of FIG. 5 in a step curing the film.

Referring now to FIG. 6, therein is shown the structure of FIG. 5 in a step curing the film 106. The film piece 524 of FIG. 5 can be cured forming the film 106 having the overhang portion 216 overhanging the edges of the bottom integrated circuit 214 and over a portion of the first interconnects 110. The curing process can also attach the top integrated circuit 108, the film 106, and the bottom integrated circuit 214.

Figure 7:
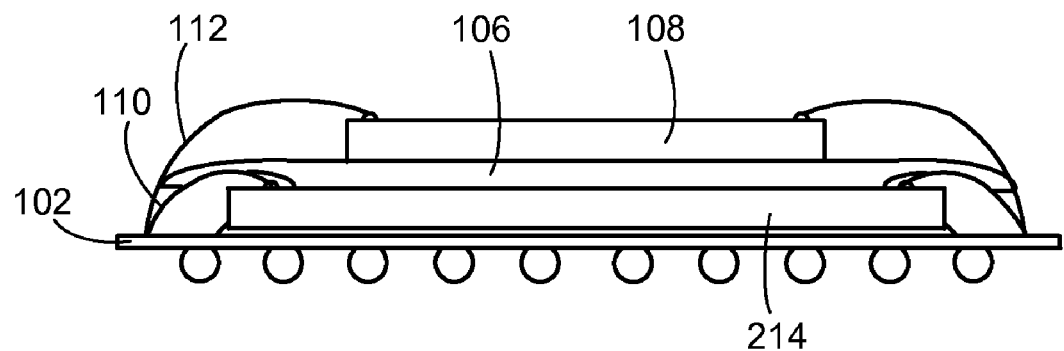
FIG. 7 is the structure of FIG. 6 in a step attaching the second interconnects.

Referring now to FIG. 7, therein is shown the structure of FIG. 6 in a step attaching the second interconnects 112. The second interconnects 112 can connect the carrier 102 and the top integrated circuit 108. The film 106 separates the first interconnects 110 and the second interconnects 112 preventing inadvertent shorting. The encapsulation 218 of FIG. 2 can be formed over the carrier 102 covering the top integrated circuit 108, the bottom integrated circuit 214, the first interconnects 110, the film 106, and the second interconnects 112. The film 106 also mitigates wire sweep of the first interconnects 110 thereby mitigating or eliminating breakage of the first interconnects 110 and also resist inadvertent shorting between the first interconnects 110 and the second interconnects 112.

Figure 8:
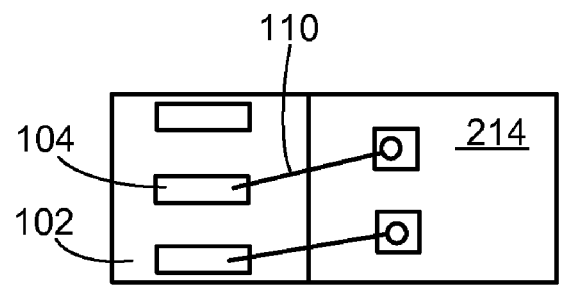
FIG. 8 is a top view of a portion of the integrated circuit package system of FIG. 1 in a step attaching the first interconnects.

Referring now to FIG. 8, therein is shown a top view of a portion of the integrated circuit package system 100 of FIG. 1 in a step attaching the first interconnects 110. The bottom integrated circuit 214 mounts over the carrier 102. The first interconnects 110 can connect the predetermined portions of the contact pads 104 of the carrier 102 and the bottom integrated circuit 214.

Figure 9:
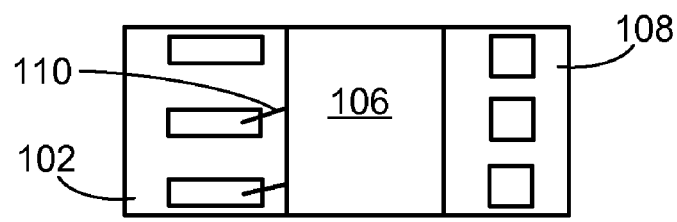
FIG. 9 is the structure of FIG. 8 in a step of curing the film.

Referring now to FIG. 9, therein is shown the structure of FIG. 8 in a step of curing the film 106. The film piece 524 of FIG. 5 is placed over the bottom integrated circuit 214 of FIG. 8 and undergoes curing for forming the film 106 having the overhang portion 216 of FIG. 2. The film 106 including the overhang portion 216 covers a portion of the first interconnects 110. The top integrated circuit 108 mounts over the film 106 and the carrier 102.

Figure 10:
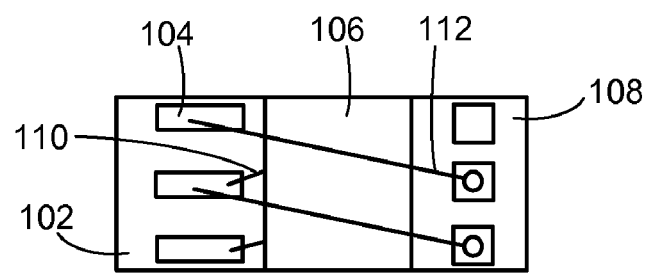
FIG. 10 is the structure of FIG. 9 in a step attaching the second interconnects.

Referring now to FIG. 10, therein is shown the structure of FIG. 9 in a step attaching the second interconnects 112. The second interconnects 112 can connect a predetermined portion of the contact pads 104 of the carrier 102 and the top integrated circuit 108. The film 106 provides separation between the first interconnects 110 and the second interconnects 112 allowing for double bonding to one of the contact pads 104 to both the bottom integrated circuit 214 of FIG. 8 and the top integrated circuit 106. For illustrative purposes, the first interconnects 110 and the second interconnects 112 are shown connecting to the same selection of the contact pads 104, although it is understood that the first interconnects 110 and the second interconnects 112 can connect to different selection of the contact pads 104.

Figure 11:
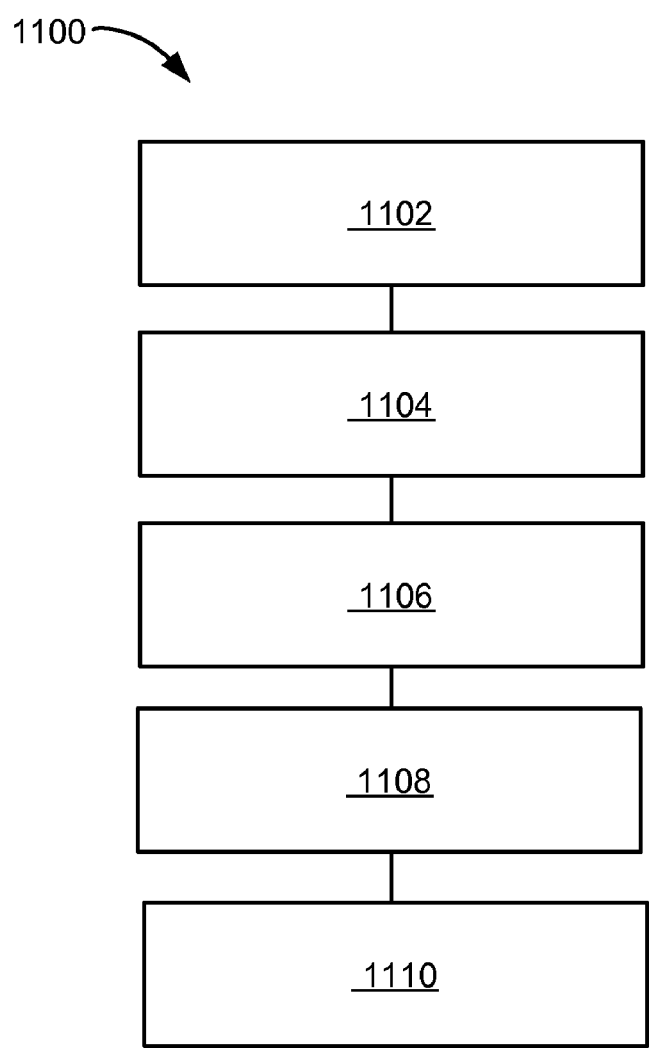
FIG. 11 is a flow chart of an integrated circuit package system for manufacturing of the integrated circuit package system in an embodiment of the present invention.

Referring now to FIG. 11, therein is shown a flow chart of an integrated circuit package system 1100 for manufacturing the integrated circuit package system 100 in an embodiment of the present invention. The system 1100 includes connecting a first interconnect between a carrier and a bottom integrated circuit thereover in a block 1102; forming a film, having an overhang portion, over the bottom integrated circuit with the overhang portion over the first interconnect in a block 1104; mounting a top integrated circuit over the film in a block 1106; connecting a second interconnect between the top integrated circuit and the carrier with the overhang portion between the first interconnect and the second interconnect in a block 1108; and forming an encapsulation over the carrier covering the top integrated circuit, the film, the first interconnect, and the second interconnect in a block 1110.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, and reducing cost of circuit system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package system comprising:
   connecting a first interconnect between a carrier and a bottom integrated circuit thereover;
   forming a film over the bottom integrated circuit, the film having an overhang portion cantilevered over the first interconnect;
   mounting a top integrated circuit over the film;
   connecting a second interconnect between the top integrated circuit and the carrier with the overhang portion in direct contact with the first interconnect and the second interconnect; and
   forming an encapsulation over the carrier covering the top integrated circuit, the film, the first interconnect, and the second interconnect.

2. The system as claimed in claim 1 wherein forming the film having the overhang portion includes forming a curved portion overhanging the bottom integrated circuit.

3. The system as claimed in claim 1 wherein forming the film having the overhang portion over the bottom integrated circuit includes overhanging the overhang portion over an edge of the bottom integrated circuit.

4. The system as claimed in claim 1 wherein forming the film having the overhang portion over the bottom integrated circuit includes covering the first interconnect over the bottom integrated circuit with the film.

5. The system as claimed in claim 1 wherein mounting the top integrated circuit over the film includes mounting the top integrated circuit over the bottom integrated circuit with the bottom integrated circuit horizontally extending beyond the top integrated circuit.

6. An integrated circuit package system comprising:
   mounting a bottom integrated circuit over a carrier;
   connecting a first interconnect between the bottom integrated circuit and the carrier;
   forming a film over the bottom integrated circuit, the film having an overhang portion cantilevered over and on the first interconnect;
   mounting a top integrated circuit over the film and the bottom integrated circuit;
   connecting a second interconnect between the top integrated circuit and the carrier with the overhang portion in direct contact with the first interconnect and the second interconnect; and
   forming an encapsulation over the carrier covering the top integrated circuit, the film, the first interconnect, the second interconnect, and the bottom integrated circuit.

7. The system as claimed in claim 6 wherein forming the film having the overhang portion includes forming an adhesive film having a curved portion.

8. The system as claimed in claim 6 wherein connecting the first interconnect between the bottom integrated circuit and the carrier includes connecting a wire between the bottom integrated circuit and the carrier.

9. The system as claimed in claim 6 wherein connecting the second interconnect between the top integrated circuit and the carrier includes connecting a wire between the top integrated circuit and the carrier.

10. The system as claimed in claim 6 further comprising attaching an external interconnect to and below the carrier.

11. An integrated circuit package system comprising:
    a carrier;
    a bottom integrated circuit over the carrier;
    a first interconnect between the carrier and the bottom integrated circuit;
    a film over the bottom integrated circuit, the film having an overhang portion cantilevered over the first interconnect;
    a top integrated circuit over the film;
    a second interconnect between the top integrated circuit and the carrier with the overhang portion in direct contact with the first interconnect and the second interconnect; and
    an encapsulation over the carrier covering the top integrated circuit, the film, the first interconnect, and the second interconnect.

12. The system as claimed in claim 11 wherein the film having the overhang portion includes a curved portion overhanging the bottom integrated circuit.

13. The system as claimed in claim 11 wherein the film having the overhang portion over the bottom integrated circuit includes the overhang portion over an edge of the bottom integrated circuit.

14. The system as claimed in claim 11 wherein the film having the overhang portion over the bottom integrated circuit includes the film over the first interconnect over the bottom integrated circuit.

15. The system as claimed in claim 11 wherein the top integrated circuit over the film includes the top integrated circuit over the bottom integrated circuit with the bottom integrated circuit horizontally extending beyond the top integrated circuit.

16. The system as claimed in claim 11 wherein:
    the top integrated circuit is over the bottom integrated circuit;
    the film is on the first interconnect; and
    the encapsulation is over the bottom integrated circuit.

17. The system as claimed in claim 16 wherein the film includes an adhesive film.

18. The system as claimed in claim 16 wherein the first interconnect includes a wire.

19. The system as claimed in claim 16 wherein the second interconnect includes a wire.

20. The system as claimed in claim 16 further comprising an external interconnect attached to and below the carrier.

* * * * *